United States Patent [19]

Abe

[11] 4,384,918

[45] May 24, 1983

[54] METHOD AND APPARATUS FOR DRY ETCHING AND ELECTROSTATIC CHUCKING DEVICE USED THEREIN

[75] Inventor: Naomichi Abe, Tokyo, Japan

[73] Assignee: Fujitsu Limited, Kawasaki, Japan

[21] Appl. No.: 304,902

[22] Filed: Sep. 23, 1981

[30] Foreign Application Priority Data

Sep. 30, 1980 [JP] Japan .................................. 55-136255
Oct. 8, 1980 [JP] Japan .................................. 55-141046

[51] Int. Cl.³ ............................................. C23C 15/00
[52] U.S. Cl. .................................... 156/643; 156/345; 204/192 E; 204/298; 361/234
[58] Field of Search .............................. 156/345, 643; 204/192 E, 298; 279/1 R, 1 M; 271/18.1, 18.2, 193; 198/691; 361/234; 118/500

[56] References Cited

U.S. PATENT DOCUMENTS

| | | | |
|---|---|---|---|
| 3,634,740 | 1/1972 | Steueko .................. | 361/234 |
| 3,916,270 | 10/1975 | Wachtuer et al. .................. | 361/234 |
| 4,184,188 | 1/1980 | Briglia .................. | 361/234 |
| 4,282,267 | 8/1981 | Kuyel .................. | 204/192 E |
| 4,292,153 | 9/1981 | Kudo et al. .................. | 204/298 |
| 4,313,783 | 2/1980 | Davies et al. .................. | 156/345 |
| 4,324,611 | 4/1982 | Vogel et al. .................. | 204/298 |

OTHER PUBLICATIONS

"Microetch Ion Beam Milling", VEECO Co. Catalog, pp. 1-29.

"Wafer Coating . . . Etching", Conference Paper of Precision Machine Society, (1979), pp. 193-194.

*Primary Examiner*—Jerome W. Massie
*Attorney, Agent, or Firm*—Staas & Halsey

[57] ABSTRACT

An electrostatic chucking device is positioned on a supporting base, the temperature of which is maintained at a predetermined value, the device having an insulator, and a pair of plane electrodes on the insulator, and a material being chucked on the bottom surface of the top surface of the insulator, wherein the sum of the area of portions of the pair of plane electrodes facing the direction of the material being approximately equal to the contact area between the material and the insulator, and wherein a voltage is applied between the plane electrodes from an external power source, thereby effectively electrostatically chucking the material to the supporting base. A method and an apparatus for dry etching of a material having at least a conductive portion therein, the material being chucked by using said electrostatic chucking device mounted on a supporting base, the temperature of which is maintained at a predetermined value, in at least one of a sputter etching apparatus, a reactive sputter etching apparatus, or a plasma etching apparatus, whereby the material is indirectly chucked to the supporting base, the heat conductivity between the material and the supporting base is increased, the temperature of the material is controlled effectively, and the material can be held invertedly in the horizontal plane or vertically.

18 Claims, 10 Drawing Figures

METHOD AND APPARATUS FOR DRY ETCHING AND ELECTROSTATIC CHUCKING DEVICE USED THEREIN

BACKGROUND OF THE INVENTION

1. Field of the Invention

The present invention relates to a method and an apparatus for dry etching and, an electrostatic chucking device used for said etching method, and in detail, a method and an apparatus for effectively controlling the temperature of a material to be etched when dry etching is performed by using either a plasma etching apparatus, a sputter etching apparatus or a reactive sputter etching apparatus, and, an electrostatic chucking device used for said dry etching method for holding and fixing the material during etching and for controlling the temperature of the material. The method and apparatus according to the present invention can be used for the production of, for example, semiconductor integrated circuits.

2. Description of the Prior Art

Dry etching is a technique by which materials such as Si, SiO₂, Si₃N₄, Al, W, Mo, Ti and the alloys of these metals and the like are etched either a plasma etching apparatus, a sputter etching apparatus or a reactive sputter etching apparatus. Particularly the dry etching technique has the following advantages over liquid etching:

(I) optically sensitive resin can be used as an etching mask, (II) the undercut of the material to be etched is small, thus a finer profiled pattern can be formed at the etching, (III) the contamination by impurities found in the liquid etching method can be protected against.

(IV) the etching control characteristic is excellent, and is more widely used than the liquid etching method.

To increase production on a production line, using etching, an increased etching speed is desired. However in order to try to increase the speed of the dry etching, the applied electric but must be high power, the generating heat caused by the plasma discharge is also increased and when the temperature of the material to be etched is raised to approximately 100 degrees centigrade, deterioration or melting of the resist, which is used for the mask, occurs and normal etching cannot be performed. The above-mentioned problems have remained unsolved. These problems are more pronounced in sputter etching or reactive sputter etching in which the material to be etched is subjected to ion impingement. Therefore, in order to increase production using these methods it is necessary to cool the material to be etched.

Contrary to the above-mentioned example concerning overheating, in some cases the high temperature of the material to be etched is advantageous. An example, is the case in which the vapor pressure of the reaction products is extremely low at the normal temperature created by plasma etching or reactive sputter etching. During etching it is generally necessary to remove the reaction products quickly. Therefore, in the above-mentioned case, it is advantageous to increase the vapor pressure of the reaction products by raising the temperature of the material to be etched, and for this reason sometimes the supporting base of the material is heated.

However, merely resting the material to be etched on the supporting base which is temperature controlled, is not sufficient. A close contact for thermal conduction is further desired so that the temperature of the supporting base can be conducted to the material to be etched with high conductivity. For example, when the material to be etched is a semiconductor wafer, the wafer has warps the lengths of which are tens of micrometers, therefore, to improve conductivity the wafer must be pressed, the warps must be corrected and the contact area must be increased. In addition, in the case of etching aimed at fine profiled processing, the adherence of dust to the material to be etched causes serious problems. To avoid these problems it is preferable that the material to be etched, if possible, be held invertedly in the horizontal plane; or vertically during etching.

The method of holding and fixing the object, the so called method of chucking, usually makes use of a mechanical chuck. When use of a mechanical chuck cannot be made or is not desirable, a method using a vacuum chuck, an electrostatic chuck or the like are known. The electrostatic chuck technique is a method based on the principle of electrostatic attracting force and is preferred for material to be etched which are comparatively light and require treatment in a vacuum condition.

The electrostatic chuck is particularly useful in the semiconductor device producing process. For example, processes such as vacuum evaporation, chemical vapor deposition (CVD), etching or the like are performed under a vacuum condition or extremely low air pressure, therefore, the vacuum chuck cannot be used.

The mechanical chuck, no matter what form the chuck takes, must cover a part of the wafer by means of the arm of the chuck and at that part of wafer the semiconductor device cannot be produced. The mechanical chuck applies the force for holding to only a portion of the wafer, thus it is inadequate to accomplish the object of reforming and making flat the warps by pressing. Thus, the mechanical chuck method is also not a desirable method.

The electrostatic chuck can be used under the vacuum condition, it needs no arm to hold the processing material, and the holding force can be applied uniformly. Thus, the electrostatic chuck method has many advantages in the semiconductor device producing processes.

As electrostatic chucks, i.e., electrostatic chucking devices, the following two types are known. One of these electrostatic chucking devices, as shown in FIG. 1, has a plane electrode 1 on which a material to be chucked 3 is located and an insulator 2 inserted therebetween. Voltage is applied between the electrode 1 and the material to be chucked 3, whereby the material to be chucked 3 is attracted. The attracting force F is shown by the following equation (1);

$$F = \tfrac{1}{2} \cdot \epsilon \cdot \frac{V^2}{d^2} \cdot S \tag{1}$$

Where, $\epsilon$ is the dielectric constant, V is the applied voltage, d is the thickness of the insulator layer, and S is the area of the electrode.

In this method, since the voltage is applied between the material to be chucked 3 and the electrode 1, electrical contact with the material to be chucked is required. For this reason, the material to be chucked 3 is limited to conductors, semiconductors, or at least a material covered with a conductive material on the surface thereof. Therefore, a semiconductor wafer covered with an insulator such as $SiO_2$ film cannot be treated using the above mentioned method.

The other whom electrostatic chuck example is shown in FIGS. 2 and 3. This example has electrodes 4 and 5 which are comb-shaped and intricated with each other, and the material to be chucked 3' is located on the electrodes 4 and 5 with the insulator 2 inserted therebetween. This type of electrostatic chuck is a device which attracts an insulator such as a sheet of paper. In this example, since the interval space between the pair of electrodes is designed to be extremely narrow, a strong electric field is generated between the electrodes. In this method the attractive force is produced between the polarized charges, i.e., the charge induced on the material to be chucked 3', and the other side charge which appears on the electrodes. This method is also used for chucking non-conductive materials, thus it has a wider application than the attracting force in the method of FIG. 1, however the attracting force is weaker.

The principle of the electrostatic chucking device according to the present invention is explained below. Reference is first made to FIGS. 5 and 10; FIG. 10 is an electrically equivalent circuit of the circuit in FIG. 5. Since the material to be chucked 3 is conductive, the electrostatic capacities C1 and C2 exist between the material to be chucked 3 and the electrodes 4 and 5, respectively, and the material to be chucked and the electrodes can be considered condensers. These condensers are connected in series through the lines illustrated in FIG. 5 and the material to be chucked 3.

If the electrical potential of the electrodes 4 and 5 is V1 and V2, respectively, and the electrical potential of the material to be chucked is V12, V12 is shown by the following equation:

$$V12 = \frac{C1}{C1 + C2} V1 + \frac{C2}{C1 + C2} V2 \quad (2)$$

It is known that when the voltage is applied across the condenser, the electrostatic force operates between the electrodes of the condenser, and the value of this electrostatic force is expressed in the equation (1). Since the voltage being applied across the condenser C1 and C2 are (V12−V1) and (V12−V2), respectively, the electrostatic attracting force F(C1, C2) is shown by the following equation (where S1 and S2 are electrode areas of the condensers C1 and C2, respectively):

$$F(C1, C2) = \tfrac{1}{2} \frac{\epsilon}{d^2} \{(V12 - V1)^2 S1 + (V12 - V2)^2 S2\} \quad (3)$$

Using the relations $$C1 = \frac{\epsilon S1}{d}, C2 = \frac{\epsilon S2}{d} \quad (4)$$

and equation (2), F(C1, C2) is then shown by the following equation (5):

$$F(C1, C2) = \tfrac{1}{2} \frac{\epsilon}{d^2} \frac{S1 S2}{S1 + S2} (V2 - V1)^2 \quad (5)$$

$$= \tfrac{1}{2} \frac{\epsilon}{d^2} \frac{S1 S2}{S1 + S2} V^2$$

where $V = |V1 - V2|$ \quad (6)

As can be understood from the equation (5), the attracting force is proportional to the dielectric constant, the area of the electrode, and the square of the voltage, but is inversely proportional to the square of the insulator thickness. F(C1, C2) becomes maximum when $$S1 = S2 = \frac{S1 + S2}{2} = \frac{S}{2},$$

and in this case F(C1, C2) is shown as the equation (7):

$$F(C1, C2) = \frac{\epsilon}{8} \frac{V^2}{d^2} \cdot S \quad (7)$$

The present invention applies the above mentioned principle in order to solve the problems in the conventional method and apparatus for dry etching, and the conventional electrostatic chucking device.

SUMMARY OF THE INVENTION

One object of the present invention is to provide an electrostatic chucking device which can be applied to electrically conductive materials such as a semiconductor wafer a including conductor and semiconductor, and to electrically conductive materials covered with a thin insulating film on the surface thereof, and which chucking device has a stronger attracting force and a more simple structure than known in the art.

Another object of the present invention is to provide a method and an apparatus for dry etching which can indirectly chuck the material to be etched to the supporting base and make the supporting base highly heat conductive by using the electrostatic chucking device to hold and fix the material to be etched during dry etching (either plasma etching, sputter etching or reactive sputter etching, and thereby allowing the temperature of the material to be etched to be controlled effectively and the material to be etched to be held invertedly in the horizontal plane or vertically.

According to one aspect of the preset invention, there is provided an electrostatic chucking device positioned on a supporting base, the temperature of which can be maintained at a predetermined value, the electrostatic chucking device comprising a sheet of insulator supporting base, and a pair of plane electrodes being electrically isolated from each other and being positioned on the bottom surface of said sheet of insulator in close contact therewith, and an external power source which supplies a voltage between said plane electrodes so that said material can be chucked on said sheet of insulator. The device is capable of chucking a material having at least a conductive portion thereon, wherein the sum of the area of the portions of said pair of plane electrodes facing the direction of said material is approximately equal to the contact area between said material and said sheet of insulator when said material is chucked.

According to another aspect of the present invention, there is provided a method for dry etching of a material having at least a conductive portion therein, using at least one of the following: a sputter etching apparatus, a reactive support etching apparatus or a plasma etching apparatus, and comprising the steps of: putting the material to be etched on electrostatic device which is mounted on a supporting base, the temperature of which is maintained at a predetermined value, the electrostatic device comprises a sheet of insulator, and a pair of plane electrodes being electrically isolated from each other and being positioned on the bottom surface of said sheet of insulator in close contact therewith, and an external power source which supplies a voltage between said plane electrodes, so that the material can be chucked on said sheet of insulator, and wherein the sum of the area of the portions of said pair of plane electrodes facing the direction of said material is approximately equal to the contact area between said material and said sheet of insulator when said material is chucked; applying the voltage between said pair of plane electrodes of the electrostatic device from the external power source, and thereby, causing said material to be chucked, and therefore indirectly fixed electrostatically to said supporting base for etching by etching gases in the etching chamber of the sputter etching apparatus, the reactive sputter etching apparatus or the plasma etching apparatus.

According to a further aspect of the present invention, there is provided an apparatus for dry etching a material having at least a conductive portion therein and using at least a sputter etching apparatus, a reactive sputter etching apparatus or a plasma etching apparatus, comprising: a supporting base, the temperature of which is maintained at a predetermined value, an electrostatic chuck mounted on the supporting base for chucking said material, the electrostatic chuck comprises a sheet of insulator and a pair of plane electrodes being electrically isolated from each other and being positioned on the bottom surface of said sheet of insulator in close contact with said sheet, wherein the sum of the portion of the area of said pair of plane electrodes facing said material being approximately equal to the contact area between said material and said sheet of insulator when said material is chucked, and a voltage from an external power source being applied between said pair of plane electrodes, so that said material can be chucked on said sheet of insulator.

DESCRIPTION OF THE PREFERRED EMBODIMENTS

Below, embodiments of the present invention is explained using FIGS. 4-10.

Figure 5:
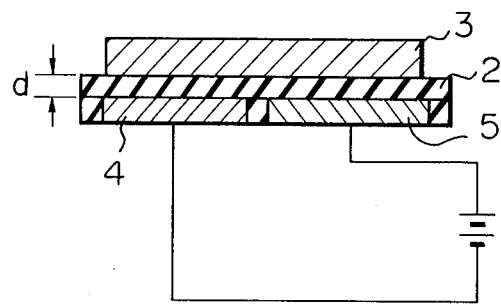
FIG. 5 is a side view illustrating an electrostatic chucking device according to an embodiment of the present invention.
Figure 7:
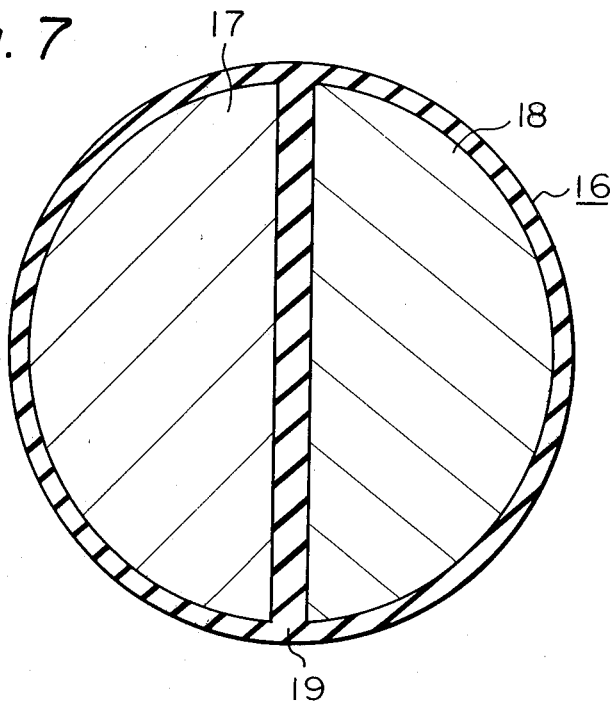
FIG. 7 is a plan view taken along the line VII—VII of the device in FIG. 6.

FIG. 5 is a cross-sectional view and wiring diagram of an electrostatic chucking device according to the present invention. The plan view of electrodes in the electrostatic chucking device in FIG. 5 is shown in FIG. 7. A material to be chucked 3 can be attracted by applying approximately 1000 to 5000 volts between a pair of plane electrodes 4 and 5. For example, electrodes made of aluminum can be used as electrodes 4 and 5, an insulator made of material such as polytetrafluoroethylene or polyethylene can be used as the insulator 2, and preferably the thickness d of the insulator 2 is approximately 50 to 200 micrometers.

[Experiment 1]

Figure 1:
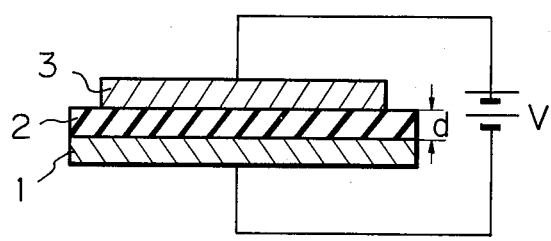
FIG. 1 is a side view illustrating one conventional electrostatic chuck device.
Figure 2:
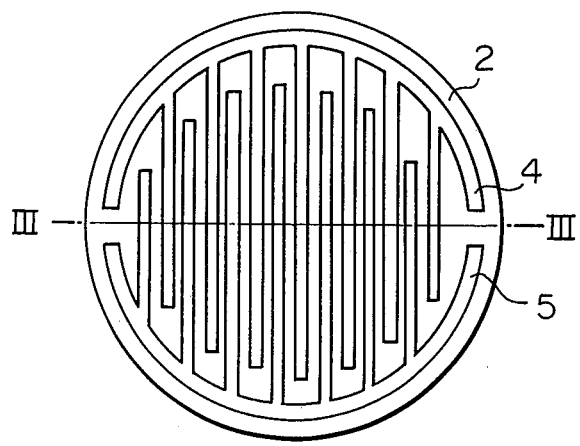
FIG. 2 is a plan view illustrating another example of a conventional electrostatic chucking device.

The performance of the following electrostatic chucking devices is compared, namely, a conventional device (1) as depicted in FIG. 1, a conventional device (2) as depicted in FIG. 2, and a device according to the present invention, by referring to the results of the experiment hereinbelow. In the devices used for the experiment, the area of the chucking portion is 100 square centimeters and the thickness of the insulator is 100 micrometers. Polyethylene is used as the material of the insulators, and alumina plates, silicon wafers, silicon wafers with $SiO_2$ film of 1 micrometer on the surface and quartz plates are used as the materials to be chucked. An applied voltage is 1000 volts.

The results of the above mentioned experiment regarding the electrostatic chucking devices are shown in following table:

TABLE

| | | Electrostatic chucking force (gram-weight) | | | |
| | | The material to be etched | | | |
| | | Al plate | Si wafer | Si wafer + $SiO_2$ | Quartz plate |
|---|---|---|---|---|---|
| Electrostatic chucking device | Conventional ex. (1) | 1130 | 1210 | 0 | 0 |
| | Conventional ex. (2) | 140 | 130 | 130 | 20 |
| | Present invention | 310 | 290 | 310 | 0 |

Conventional ex. (1): Device in FIG. 1
Conventional ex. (2): Device in FIG. 2

Figure 3:
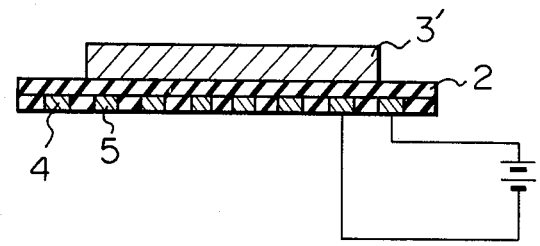
FIG. 3 is a cross-sectional view taken along the line III—III of FIG. 2 showing an electrostatic chucking device.

It is found from the table that the electrostatic chucking device according to the present invention can be used for etching conductors, semiconductors, and conductors and semiconductors covered with a thin insulating film on the surface. The attracting force of the electrostatic chucking device according to the present invention is weaker than the attracting force of the conventional electrostatic chucking device in FIG. 1; however, it is about twice as strong as the conventional electrostatic chucking device of FIG. 2 and 3. According to the above mentioned characteristics, the electrostatic chucking device according to the present invention is the most advantageous of the above three examples as an electrostatic chucking device for treating a semiconductor wafer covered with insulating film, such as $SiO_2$ or $Si_3N_4$ films, and also facilities manufacturing the device since the structure of the device is simple.

Figure 8:
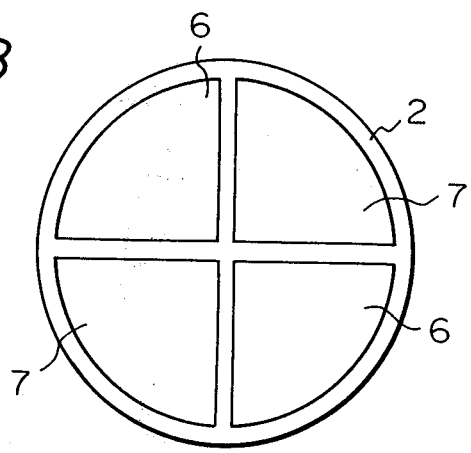
FIG. 8 is a plan view of electrodes of an electrostatic chucking device according to another embodiment of the present invention.
Figure 9:
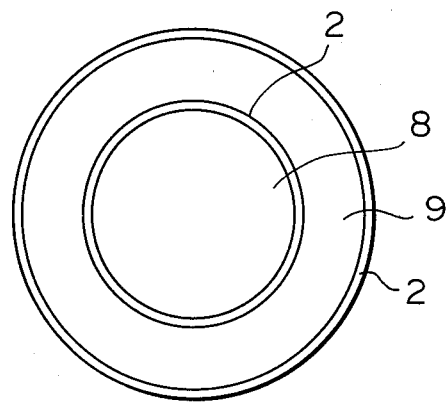
FIG. 9 is a plan view of electrodes of an electrostatic chucking device according to a further embodiment of the present invention.
Figure 10:
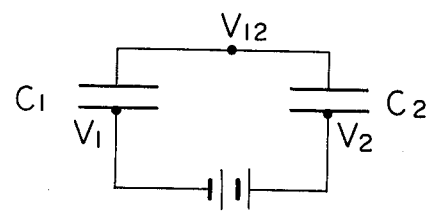
FIG. 10 is an equivalent circuit diagram of the electrostatic chucking device of FIG. 5.

In FIGS. 8 and 9, other embodiments of the electrostatic chucking device according to the present invention are shown. In these embodiments, the shapes of the electrodes are changed from the shape of the electrodes in FIG. 7. The shape of the electrodes in FIG. 8 is divided into four parts and electrodes 6 and 7 are symmetrical about a center point, and in FIG. 9, an example having concentric-form electrodes 8 and 9 is shown.

Figure 4:
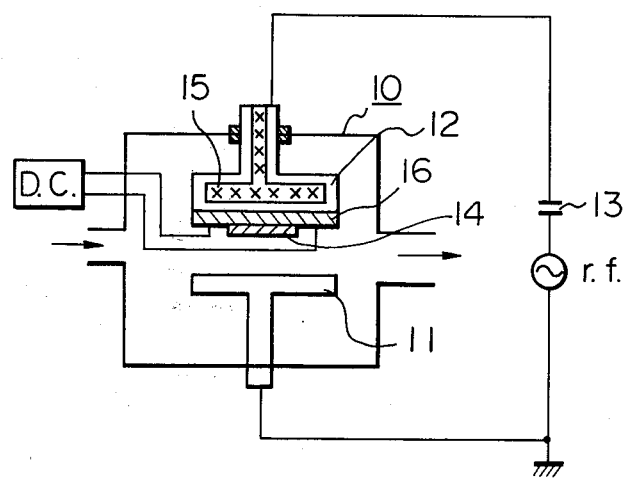
FIG. 4 is a diagrammatic view illustrating the preferred embodiment of the present invention using a reactive sputter etching apparatus.

FIG. 4 is a diagrammatic view of a reactive sputter etching apparatus 10 using generally the method for dry etching according to the present invention. In FIG. 4 an anode 11 is grounded and a cathode 12 is supplied with high frequency voltage (r.f.) through a condenser 13, and then etching is performed. The material to be etched 14 is attracted to the cathode 12 by an electrostatic chucking device 16. Namely, the cathode 12 is also the supporting base of the material to be etched 14, and the cathode or the supporting base 12 has either a water jacket 15 to keep the base cool with water or an appropriate electric heater to heat the base, as well as the electrostatic chucking device 16 having a pair of plane electrodes. The arrows in the Figure indicate the direction of gas flow.

Figure 6:
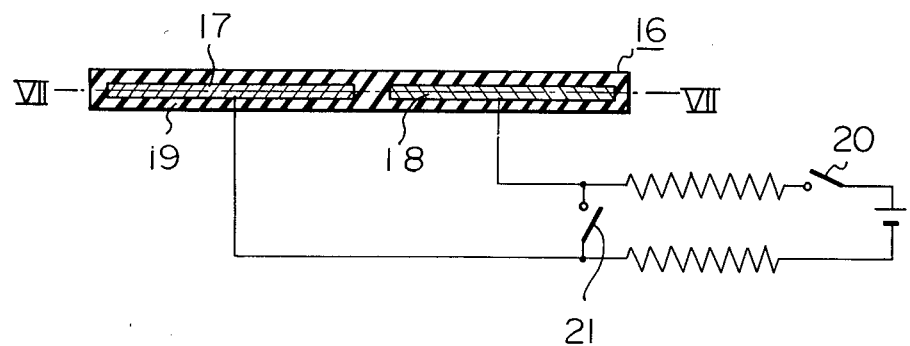
FIG. 6 is a detailed view of the device of FIG. 5.

The electrostatic chucking device 16 includes a pair of plane electrodes 17 and 18 as shown by the sectional and plan view in FIGS. 6 and 7, respectively. For example, by the electric wiring as shown in FIG. 6, a voltage of approximately 1000 through 2000 volts is applied between the electrodes 17 and 18, and the material to be etched 14 is undirectly chucked to the supporting base 12 electrostatically. Then the heat conductivity between the material to be etched 14 and the supporting base 12 is increased. The electrode plate 16 is constructed, for example, with aluminum electrodes 17 and 18 buried in an insulating layer 19 made of silicon gum.

The thickness of the first layer of the insulating laye 19 is preferably approximately 0.05 through 0.2 mm. The insulating layer 19 desirably has elasticity so that the insulating layer 19 can contact closely with the material to be etched. The resistors in the electric wiring of FIG. 6 are filters and prevent the high frequency electric field from being lost through the external power source circuit or, in other words, from being shielded by the plane electrodes of the electrostatic chucking device. The resistant value must be determined sufficiently higher than plasma impedance. Instead of electrical resistance, coils can be used, and the impedance of the coil must be determined similarly as in the case of resistance. In FIG. 6 the reference numeral 20 shows a power switch and the reference numeral 21 shows a switch for leaking.

[Experiment 2]

In order to explain the effect of the method for dry etching according to the present invention, the results of an experiment using silicon wafers as the material to be etched in the apparatus of FIG. 4 are explained below.

The experiment was performed using the following steps. In the quartz chamber a silicon wafer is arranged as shown in FIG. 4, sputter etching or reactive sputter etching is started, and after initiating the discharge the temperature of the wafer is measured. Where the generating heat quantity becomes equal to the loss of heat, namely the temperature of the wafer is at equilibrium, the temperature of the wafer is obtained when using and also when not using the electrostatic chucking device.

The electrostatic chucking device used in experiment 2 has a pair of plane electrodes, made of aluminum as shown in FIGS. 6 and 7, and polytetrafluorethylene having a thickness of 0.1 mm is coated as an insulating layer on the surface of the electrodes. The results obtained from the experiment are as follows:

Sputter etching condition: Argon 13.33 Pa (0.1 Torr)
Applied electric power: 300 watts
  (a) Balancing temperature of the wafer with an electrostatic chucking device: 50 degrees cenntrigrade
  (b) Balancing temperature of the wafer without an electrostatic chucking device: 230 degrees centigrade In a further experiment using the apparatus in FIG. 4 aluminum was etched with $CCl_4$.
Etching condition: $CCl_4$ 13.33 Pa (0.1 Torr), applied electric power 800 watts In the above described condition using the electrostatic chucking device 16, the aluminum could be etched at the high etching rate of 3 micrometers/minutes. However, if the electrostatic chucking device 16 is not used, when the applied electric power rises to at least 200 watts or above, the resist film on the wafer is destroyed because of high temperature caused by the high density of plasma excited thereby, and the etching rate must be decreased to approximately 0.3 micrometers/minutes.

[Experiment 3]

Examples of the present invention being applied to barrel type plasma etching or microwave excited plasma etching are explained below. In these examples a wafer is located on a supporting base cooled by water, an electrostatic chucking device was inserted therebetween and was etched under the condition of Argon 13.33 Pa (0.1 Torr) and an applied electric power of 300 watts by a barrel type plasma etching process, and then the temperature of the wafer was balanced at 35 degrees centigrade. In the case without the electrostatic chucking device, the temperature of the wafer rises to 120 degrees centigrade.

In both the microwave excited plasma etching and the barrel type plasma etching, an excellent cooling effect was obtained by the method for dry etching according to the present invention as shown below:
Etching condition: Argon 13.33 Pa (0.1 Torr); applied electric power 300 watts
  (a) Balancing temperature of the wafer with an electrostatic chucking device: 60 degrees centigrade
  (b) Balancing temperature of the wafer without an electrostatic chucking device: 230 degrees centigrade As explained above, according to the present invention, the great amount of heat being generated at the wafer can be removed effectively, allowing thereby the high rate of etching by the high electric power to be performed by sputter etching, reactive sputter etching or plasma etching. Further, the method according to the present invention can be applied when either conductive materials, semiconductors or the insulating film on these materials are to be etched. Also, the method can be applied when either the material to be etched is treated on the anode, the cathode or any portion in the plasma. Moreover, said electrostatic chucking device can be used both in plasma and in a vacuum atmosphere.

When it is desired that the material to be etched be located vertically invertedly in the horizontal plane, the electrostatic chucking device is located on the supporting base, and the material to be etched is then put on the electrostatic chucking device after the voltage is applied to the electrostatic chucking device and the material to be etched is indirectly chucked to the supporting base, the location of the material to be etched can be regulated by the rotation of 90 degrees or 180 degrees of the electrode portion in the dry etching apparatus. By using the above-mentioned procedure, defects in the etched pattern due to the dust can be decreased considerably.

[Experiment 4]

In this experiment, the etching of an Aluminum-Copper (Al-Cu) alloy was attempted. The method of the experiment is explained below. The etching was performed using the etching apparatus in FIG. 4 heated with a heater at the electrode temperature of approximately 250 degrees centigrade. The heater was provided in the supporting base so that the nichrome wire of the heater was insulated from the supporting base with a ceramic such as alumina. In order not to transmit the high frequency electric power to the nichrome wire, it is recommended that the voltage be applied to the heater as well as to the electrostatic chucking device through coils. $SiO_2$ was used as an etching mask, and $CCl_4$ was used as the etching gas.

Comparing the result from the apparatus having the heater with an electrostatic chucking device with the result from the apparatus having no heater, a granular residue remained on the material to be etched in the case of using no heater, whereas in the case of using a heater, the granular residue could not be found. This fact is explained according to the following consideration. Namely, it is supposed that the Al-Cu alloy is etched due to the following reactions:

$Al + 3Cl \rightarrow AlCl_3$ $Cu + 2Cl \rightarrow CuCl_2$

Also it is supposed that since the vapor pressure of $CuCl_2$ is very low, Cu or $CuCl_2$ remains as residue if the temperature of the material to be etched is not raised by heating. Thus, using the heater with an electrostatic chucking device advantageously minimizes residue.

I claim:

1. An electrostatic device for chucking a material having at least a conductive portion, comprising:
   (a) a sheet of insulator;
   (b) a pair of plane electrodes positioned on the bottom surface of said sheet of insulator in close contact with said sheet, wherein
      (i) said pair of plane electrodes is electrically isolated from each other,
      (ii) voltage being supplied between said pair of plane electrodes from an external voltage source, such that said plane electrodes are capable of chucking the conductive material on the top surface of said sheet of insulator, and
      (iii) the sum of the area of the portions of said pair of plane electrodes facing the direction of said material is approximately equal to the contact area between said material and said sheet of insulator when said material is chucked.

2. An electrostatic device as defined in claim 1, wherein said pair of electrodes is embedded in said insulator.

3. An apparatus for dry etching of a material having at least a conductive portion and using at least a sputter etching apparatus, a reactive sputter etching apparatus or a plasma etching apparatus, comprising:
   (a) a supporting base, the temperature of which is maintained at a predetermined value;
   (b) an electrostatic chuck mounted on the supporting base for chucking the material to be dry etched and having,
      (i) a sheet of insulator positioned on the top surface of said electrostatic chuck and,
      (ii) a pair of plane electrodes positioned on the bottom surface of said sheet of insulator in close contact with said sheet, wherein said pair of plane electrodes is electrically isolated from each other, the sum of the area of the portions of said pair of plane electrodes facing the direction of said material being approximately equal to the contact area between said material and said sheet of insulator when said material is chucked, voltage being supplied between said pair of plane electrodes from an external voltage source so that said material can be chucked on said sheet of insulator; and
   (c) an etching chamber wherein gases are applied with electric power to form a plasma for etching.

4. An apparatus as defined in claim 3, wherein said pair of electrodes is embedded in said insulator.

5. The electrostatic chucking device of claim 1 or 3, wherein the shape of each of said plane electrodes is semispherical.

6. The electrostatic chucking device of claim 1 or 3, wherein each of said plane electrodes comprises two quarters to a circle with all four quarters being positioned symmetrically about a center point.

7. The electrostatic chucking device of claim 1 or 3, wherein the shapes of each of said plane electrodes is a concentric circle.

8. The electrostatic chucking device of claim 1 or 3, wherein the thickness of the insulator is approximately 50 to 200 micrometers.

9. The electrostatic chucking device of claim 1 or 3, wherein the insulator is elastic relative to the material to be etched so that the insulator can contact closely with the material.

10. The electrostatic chucking device of claim 1 or 3, wherein the insulator is polyethylene.

11. The electrostatic chucking device of claim 1 or 3, wherein the insulator is polytetrafluorethylene.

12. The electrostatic chucking device of claim 1 or 3, wherein the insulator is silicon gum.

13. A method for dry etching of a material having at least a conductive portion, using at least one of a sputter etching apparatus, a reactive sputter etching apparatus or a plasma etching apparatus, comprising the steps of:
   (a) putting the material to be etched on an electrostatic device having,
      (i) a sheet of insulator, and
      (ii) a pair of plane electrodes positioned on the bottom surface of said sheet of insulator in close contact with said sheet, wherein said pair of plane electrodes is electrically isolated from each other, voltage being supplied between said pair of plane electrodes from an external voltage source to cause the material to be chucked on the top surface of said sheet of insulator, the electrostatic device being positioned on a supporting base, the temperature of which is maintained at a predetermined value, and the sum of the area of the portions of said pair of plane electrodes facing the direction of said material is approximately equal to the contact area between said material and said sheet of insulator when said material is chucked, (b) applying a voltage between said pair of plane electrodes of said electrostatic device from the external power source to cause said material to be chucked electrostatically and thereby indirectly fixed to said supporting base;

(c) introducing etching gases into the etching chamber of one of said sputter etching apparatus, said reactive sputter etching apparatus, or said plasma etching apparatus and applying an electric field to said gases by another power source to form a plasma, and (d) etching of said material at the condition of high heat conductivity between said material and said supporting base, said high heat conductivity being obtained by the electrostatic chucking force resulting in an increase in thermal contact therebetween, whereby the temperature of said material is controlled close to said predetermined value.

14. A method for dry etching as defined in claim 2, using at least one of said sputter etching apparatus or said reactive sputter etching apparatus, wherein said supporting base is an electrode to which high frequency voltage is applied to form the plasma.

15. A method for dry etching as defined in claim 14 wherein said voltage of said external power source means is of direct current or of low frequency and is applied to said pair of plane electrodes through high frequency eliminating filters.

16. A method for dry etching as defined in claim 13, 14 or 15, wherein said material is etched while said material is being indirectly chucked on said supporting base by said electrostatic device.

17. A method for dry etching as defined in claim 13, 14 or 15, wherein said material is etched while said material is being indirectly chucked on said supporting base by said electrostatic device while in the vertical plane.

18. A method for dry etching as defined in claim 13, 14 or 15, wherein said material is etched while said material is being indirectly chucked on said supporting base by said electrostatic device and while being invertedly held in the horizontal plane.

* * * * *

UNITED STATES PATENT AND TRADEMARK OFFICE
CERTIFICATE OF CORRECTION

PATENT NO. : 4,384,918

DATED : 5/24/83

INVENTOR(S) : NAOMICHI ABE

It is certified that error appears in the above-identified patent and that said Letters Patent is hereby corrected as shown below:

ABSTRACT

Line 4, after "on" insert --the bottom surface of--;
Line 5, after "on" delete "the bottom surface of";

Col. 1, line 25, after "etched" insert --using--;
line 42, after "electric" change "but must be high power," to --power must be high, but--.

Col. 2, line 22, change "material" to --materials--;
line 54, after "(1)" change the semicolon (;) to a colon (:).

Col. 3, line 4, after "other" delete --whom-- and insert --known--;
line 11, delete "interval";
line 16, delete "side";
line 18, delete "non-".

UNITED STATES PATENT AND TRADEMARK OFFICE
CERTIFICATE OF CORRECTION

PATENT NO. : 4,384,918

DATED : 5/24/83

INVENTOR(S) : NAOMICHI ABE

It is certified that error appears in the above-identified patent and that said Letters Patent is hereby corrected as shown below:

Col. 4, line 26, after "wafer" delete --a--; after "including" insert --a--;
       line 39, after "etching" insert a parenthesis --)--;
       line 47, delete --sup- --;
       line 48, delete --porting base,--.

Col. 5, line 35, delete "the portion of"; after "of" (second occurrence) insert --the portions of--;

Col. 7, line 15, after "is" insert --effectively--;
       line 30, change "undirectly" to --indirectly--.

Col. 8, line 33, after "wafer" change "is" to --was--;
       line 55, after "allowing" delete --thereby--; after "effectively" insert --thereby--.

Col. 9, line 9, after "to" delete --the--.

Signed and Sealed this

Twenty-ninth Day of November 1983

[SEAL]

Attest:

GERALD J. MOSSINGHOFF

Attesting Officer     Commissioner of Patents and Trademarks